United States Patent
Jones et al.

(10) Patent No.: US 8,421,531 B2
(45) Date of Patent: Apr. 16, 2013

(54) LOW DISSIPATION AMPLIFIER

(75) Inventors: Owen Jones, Ipswich (GB); Lawrence R. Fincham, Santa Rosa, CA (US)

(73) Assignee: THX Ltd, San Rafael, CA (US)

( * ) Notice: Subject to any disclaimer, the term of this patent is extended or adjusted under 35 U.S.C. 154(b) by 0 days.

(21) Appl. No.: 13/177,506

(22) Filed: Jul. 6, 2011

(65) Prior Publication Data

US 2012/0169418 A1    Jul. 5, 2012

Related U.S. Application Data

(63) Continuation of application No. 12/713,015, filed on Feb. 25, 2010, now Pat. No. 8,004,355.

(60) Provisional application No. 61/155,382, filed on Feb. 25, 2009.

(51) Int. Cl.
*H03F 1/24* (2006.01)

(52) U.S. Cl.
USPC .............................................. 330/98; 330/99

(58) Field of Classification Search .................... 330/98, 330/99, 150, 310
See application file for complete search history.

(56) References Cited

U.S. PATENT DOCUMENTS

| | | | |
|---|---|---|---|
| 3,530,244 A | 9/1970 | Reiffin | |
| 3,551,839 A * | 12/1970 | Barker | 330/99 |
| 3,622,899 A | 11/1971 | Eisenberg | |
| 3,792,367 A | 2/1974 | Fleischer et al. | |
| 3,970,953 A | 7/1976 | Walker et al. | |
| 4,189,681 A * | 2/1980 | Lawson et al. | 330/109 |
| 4,218,660 A | 8/1980 | Carver | |
| 4,337,441 A | 6/1982 | Kellogg | |
| 4,367,442 A | 1/1983 | Tanaka et al. | |
| 4,441,068 A | 4/1984 | Smith | |
| 4,445,095 A | 4/1984 | Carver | |
| 4,507,619 A | 3/1985 | Dijkstra et al. | |
| 4,523,152 A | 6/1985 | Garde | |
| 4,586,002 A | 4/1986 | Carver | |
| 4,603,282 A | 7/1986 | Close | |
| 5,157,353 A | 10/1992 | Lendaro | |
| 5,594,387 A | 1/1997 | Kagawa | |
| 5,748,753 A | 5/1998 | Carver | |
| 6,104,238 A | 8/2000 | Mattisson et al. | |

(Continued)

OTHER PUBLICATIONS

Walker, P.J., et al., "Current Dumping Audio Amplifier," Acoustical Mfg. Co. Ltd., Huntingdon, England, L-46, Wireless World, Feb. 1971, 5 pages.

(Continued)

*Primary Examiner* — Henry Choe
(74) *Attorney, Agent, or Firm* — Irell & Manella LLP

(57) ABSTRACT

A low dissipation, low distortion amplifier includes a driver amplifier stage and a main output stage, with a plurality of impedance networks providing, among other things, feedback paths from outputs of the driver and main output stages to the input of the driver stage. The impedance networks also provide coupling paths from the outputs of the driver and main output stages to the load. The impedance networks can all be formed of resistors, capacitors, or network combinations thereof. An additional feedback path can be added from the load to the driver stage to flatten out the frequency response at low frequencies. The driver and main output stages may be operated in Class AB and B modes respectively, and/or in Class G or H modes. An intermediate amplifier driver stage may be added between the driver and main output stages.

33 Claims, 6 Drawing Sheets

U.S. PATENT DOCUMENTS

| | | | |
|---|---|---|---|
| 6,166,605 | A | 12/2000 | Carver |
| 6,201,442 | B1 | 3/2001 | James et al. |
| 6,373,335 | B1 | 4/2002 | Carver |
| 6,373,340 | B1 | 4/2002 | Shashoua |
| 7,239,202 | B1 * | 7/2007 | Aram ............................ 330/99 |
| 7,279,970 | B2 * | 10/2007 | Yokoyama et al. ............. 330/99 |
| 7,403,067 | B1 * | 7/2008 | Aram ............................ 330/98 |
| 2002/0089313 | A1 | 7/2002 | Sashoua |
| 2002/0094795 | A1 | 7/2002 | Mitzlaff |
| 2002/0153940 | A1 | 10/2002 | Wurcer et al. |

OTHER PUBLICATIONS

Vanderkooy, John, et al., "Feedforward Error Correction in Power Amplifiers," Journal of the Audio Engineering Society, Jan./Feb. 1980, vol. 28, No. 1/2, pp. 2-16.

STA550, 50+50W Stereo Bash Power Amplifier, Product Review, STMicroelectronics, Jul. 2001.

STA5150, 150W Mono Bash Power Amplifier, Product Review, STMicroelectronics, Jul. 2001.

STA5100, 100W Mono Bash Power Amplifier, Product Review, STMicroelectronics, Aug. 2001.

"Understanding BCA class-I," Crown Audio Inc., 2002.

Assembling Instructions, FT326, 70W Class H Booster, Futurel, undated.

"TDA 1560; 70 W high efficiency power amplifier with diagnostic facility" Koninklijke Philips NY, 2002.

"Audio Power Amplification", J. Audio Eng. Soc., vol. 54, No. 4, pp. 319-323 Apr. 2006.

Bortoni, Rosalfonso et al., "Convention Paper 5358: Analysis, Design Assessment of Class A, B, AB, G and H 2 Audio Power Simplifier Output Stages Based on MATLAB Software", Audio Engineering Society 110th Convention, May 12-15, 2001, Amsterdam, The Netherlands.

NXP Semiconductors, Product Data Sheet: TDF8590TH, Apr. 23, 2007, found at :http://datasheetz.com/NXP/TDF8590TH_2ITDF8590TH_2.html.

Graf, R. and Sheets, W. Encyclopedia of Electronic Circuits, United States of America: McGraw-Hill, 1999, vol. 7, ISBN 0-07-015116-4, pp. 42-43.

"International Preliminary Report on Patentability" dated Aug. 30, 2011 for PCT Patent Application No. PCT/US2010/025455.

\* cited by examiner

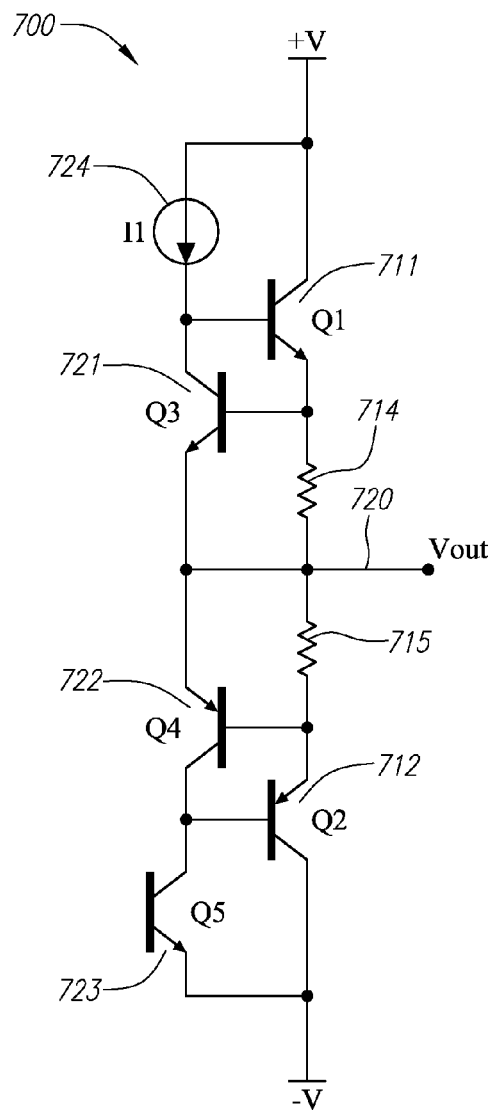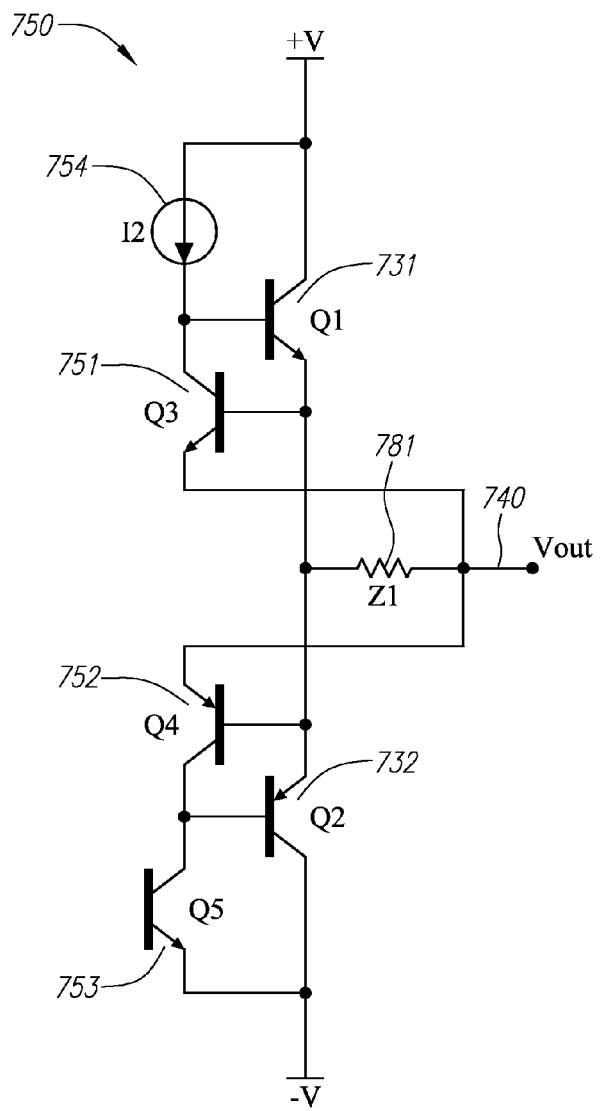
FIG. 7A
(Prior Art)
FIG. 7B

LOW DISSIPATION AMPLIFIER

RELATED APPLICATION INFORMATION

This application is a continuation of U.S. patent application Ser. No. 12/713,015 filed Feb. 25, 2010, currently pending, which claims the benefit of U.S. Provisional Application Ser. No. 61/155,382 filed on Feb. 25, 2009, hereby incorporated by reference as if set forth fully herein.

BACKGROUND OF THE INVENTION

1) Field of the Invention

The field of the invention generally relates to amplifiers and, more specifically, to an improved method to minimize distortion and power dissipation in a compact amplifier.

2) Background

Amplifiers are used for many applications including audio signal processing, video processing, communications, control systems, satellites, and so on. Based on its power consumption characteristics, an amplifier may be categorized into one or more categories including Class A, B, AB, D, G or H. A general background of different amplifier classifications may be found, for example, in R. Bortoni, et al., "Analysis, Design and Assessment of Class A, B, AB, G and H Audio Power Amplifier Output Stages Based on MATLAB® Software," 110$^{th}$ Convention of Audio Engineering Society (AES), May 12-15, 2001, pp. 1-14, and in "Audio Power Amplification," J. Audio Eng. Soc., Vol. 54, No. 4, April 2006, pp. 319-323, both of which publications are hereby incorporated as if set forth fully herein.

A Class A amplifier is known to require a relatively large amount of standing power and is inefficient, and thus undesirable in many applications that require low power dissipation. A Class B amplifier can have very low standing power dissipation but introduces distortion. A Class AB amplifier is somewhere between the two, and uses bias currents to reduce the distortion inherent in a Class B amplifier. A Class AB amplifier has a higher power dissipation than a Class B amplifier due to the bias currents.

As equipment gets smaller, amplifiers become an increasing limitation on the ability to reduce packaging size. The inevitable limited efficiency of an amplifier leads to power dissipation that must be dissipated by a heatsink in order to prevent the amplifier getting too hot; however, a large heatsink can take up an inordinate amount of packaging space. Techniques exist to improve the efficiency over that of a standard Class AB amplifier design, and hence reduce heatsink requirements, but these approaches often lead to compromises in the bandwidth, noise or distortion performance of the amplifier.

There are at least two aspects to the power dissipation of an amplifier system. The first is commonly known as idle or standing dissipation—that is, power dissipated when the amplifier is delivering no power to the load. With a conventional linear amplifier, this standing dissipation, which includes the bias current applied to the amplifier, is primarily concentrated in the driver and output stage of the amplifier and is generally required in conventional amplifier designs to minimize crossover distortion. In a high performance audio power amplifier of a nominal 100 Watt sine wave power capability into an 8Ω load, for example, the idle current may be of the order of 100-200 milli-amps per channel. With a quiescent power supply voltage of typically +/−45 Volts, this idle current results in roughly 9-18 Watts of idle power dissipation per channel. This can be a significant problem for a stereo amplifier, but for a multi-channel amplifier it is an even larger problem, as the idle dissipation quickly becomes excessive as the number of amplifiers is increased.

For home audio amplifiers, large heatsinks can often be used to dissipate the power and keep the temperature of the power devices down, but for size-constrained applications such as automotive entertainment systems, the size and weight of the heatsink cannot be tolerated.

The idle current for an amplification system must generally be set at the time of production for optimum distortion performance and thus increases production costs. The idle current requirements can also change with temperature and age. Therefore, over time or after prolonged use, the quality of the amplifier output may deteriorate.

To add to the idle power dissipation problem, an amplifier produces extra dissipation, sometimes referred to as dynamic dissipation, when it is delivering a signal to the load. In practice, a nominal 100 Watt capability linear power amplifier may well dissipate 40 Watt worst case when delivering sine wave signals to a load. With music as the audio source for the amplifier, this figure is lower since music has a higher crest factor than sine waves, but may still approach 30 Watts per channel.

Various techniques have been employed to reduce both the idle power dissipation and the dynamic power dissipation of linear amplifiers. One technique that can be employed to reduce idle power dissipation is to decrease the output stage bias current. However, this causes crossover distortion to increase which is difficult to eradicate with conventional negative feedback around the amplifier. Also, this technique has little effect on the dynamic power dissipation.

Another approach that can reduce both idle and dynamic dissipation is to use a 'Class G' amplifier configuration. This 'Class G' nomenclature is commonly attributed to Hitachi (see "Highest Efficiency and Super Quality Audio Amplifier Using MOS Power FETs in Class G Operation," IEEE Transactions on Consumer Electronics, Vol. CE-24, No. 3, August 1978), although the basic technique appears to have been described previously (see, e.g., U.S. Pat. No. 3,622,899). A 'Class G' amplifier arrangement maintains a lower voltage across the output devices under idle conditions whilst also reducing dynamic power dissipation by ensuring that the voltage across the power devices is also reduced when driving signals to the load. Thus both the idle and dynamic power dissipation is reduced. However, the switching of the output devices between the power rails often causes glitches in the output waveform that appear as distortion. These glitches have significant high frequency energy and so are difficult to correct by negative feedback. Careful design can reduce this effect but cannot eliminate it and tends to increase high frequency dynamic power dissipation.

An alternative way of reducing amplifier dissipation is to implement a switching amplifier, and specifically a so-called 'Class D' architecture. With this design, the linear amplifier is replaced by power switches operating at typically several hundred kilohertz for a high performance audio amplifier. The nominal efficiency of this design into a resistive load can theoretically be very high, although in practice switching losses and output filter losses significantly reduce the actual efficiency. The high switching frequency can cause significant EMI problems which then require bulky inductors to prevent coupling to power supply and output lines, as well as careful screening to avoid radiation. These additions mean that although the basic amplifier components can be small and low cost, the overall size is significantly larger and more costly due to the need for the inductive and filter components. Furthermore, the continual switching causes a significant idle current due to the dynamic switching losses and the pulse width modulation (PWM) process used to generate the switching signal leads to a poor distortion performance compared to a linear amplifier.

An example of a Class D amplifier is the model TDF8590TH amplifier available from NXP Semiconductors, a company headquartered in the Netherlands. When this amplifier is configured to provide a nominal 100 Watt sine wave power to an 8Ω load, the idle dissipation is in excess of 4 Watts/channel. The total harmonic distortion (THD) is above 0.1% at 10 kHz at all levels above 10 Watts output and rises dramatically at higher output levels—and even these figures are an underestimate of the actual distortion due to the use of an AES17 filter to remove the effect of the residual switching frequency components on the measuring equipment. The intermodulation distortion (IMD) performance is much worse than a well-designed linear amplifier. The output inductors also generally must be large, in order that they do not saturate or introduce further distortion, and typically measure 4 to 5 cubic centimeters, which is a barrier to overall circuit and package miniaturization.

There remains a need therefore for an amplifier topology that can be readily miniaturized while providing low power dissipation. There further is a need for an amplifier that is capable of providing low idle and dynamic power dissipation levels, requires no bias setting, and no inductors for EMI or filtering. There further is a need for an amplifier that delivers very low distortion levels.

SUMMARY OF THE INVENTION

According to one or more embodiments, a power amplifier system and method is provided that may include one or more of the following features: a distortion reducing topology; a Class AB driver stage; a current protection mechanism; distortion reduction, especially when configured as a Class G or Class H amplifier; and a nested distortion reduction architecture.

According to an aspect of one or more embodiments, a low power, low distortion amplifier comprises a first amplifier configured as or including a driver stage, and a second amplifier configured as or including a main output stage, with a plurality of impedance networks providing feedback paths from outputs of said first amplifier and said second amplifier to an input of said first amplifier, a first coupling path from the output of said second amplifier to a load, and a second coupling path from the output of said first amplifier to the load. The impedance networks may be resistors, capacitors, or network combinations thereof. An additional feedback path may be provided from the load to the input of the first amplifier. One or more intermediate amplifier stage(s) may also be disposed between the first amplifier and the second amplifier.

According to another aspect of one or more embodiments, a method for amplifying an input source signal comprises the steps of receiving the input source signal at a first amplifier and generating a driver signal thereby; providing the driver signal to the input of a second amplifier acting as a main output stage; operating the first amplifier in a Class AB or low power dissipation mode; operating the second amplifier in a Class B, Class G, Class H and/or low power dissipation mode; and providing selective coupling or feedback connections from the outputs of said first and second amplifiers to the inputs of said first and second amplifiers and to a load to maintain operation of said first and second amplifiers in their respective modes.

According to yet another aspect of one or more embodiments as disclosed herein, a low power, low distortion amplifier includes a plurality of cascaded stages with a driver stage biased to operate in Class AB mode, a main output stage operating in a low power dissipation mode, and a plurality of impedance networks providing feedback paths or couplings between the outputs and inputs of the cascaded stages or the load so that the amplifier provides low distortion and maintains a substantially constant frequency response over a wide range of frequencies. The low power amplifier may be configured to have very low standing and dynamic power dissipation.

According to certain embodiments or variations, the first amplifier may operate in Class G or Class H mode.

Further embodiments, alternatives and variations are also described herein or illustrated in the accompanying figures.

BRIEF DESCRIPTION OF THE DRAWINGS

FIG. 7a is a schematic diagram of a current limiting circuit as known in the prior art, while 7b is a schematic diagram of an alternative current limiting circuit as may be used in connection with various embodiments as disclosed herein.

DETAILED DESCRIPTION OF PREFERRED EMBODIMENTS

Figure 1:
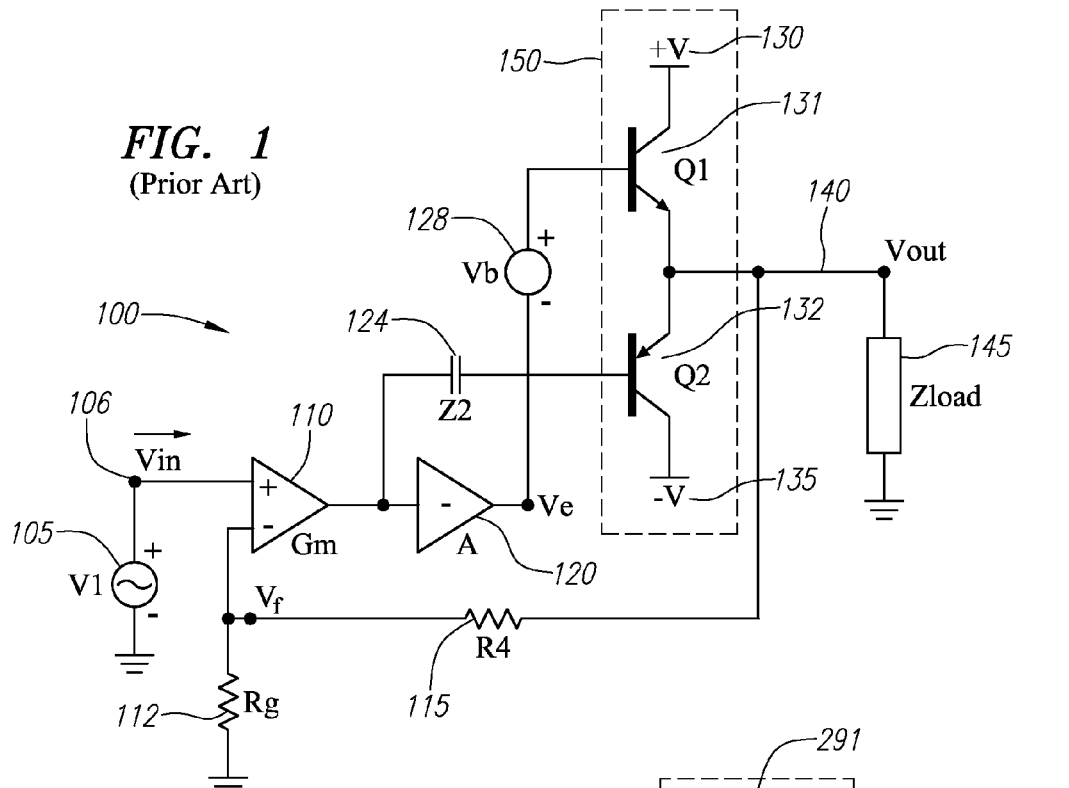
FIG. 1 is a generic schematic diagram of a conventional linear amplifier as known in the prior art.

According to one or more embodiments, a low power amplifier is provided having at least a first amplifier configured as or including a driver stage and a second amplifier configured as or including a main output stage, biased into operating modes in which they draw very little idle power, yet also consume very little dynamic power when active. A plurality of impedance networks provide, among other things, feedback paths from the outputs of the first amplifier and the second amplifier to the first amplifier, enabling in part the ability of the low amplifier to combat distortion. The impedance networks may also provide a coupling path from the output of the second amplifier including the main output stage to the load, and another coupling path from the output of the first amplifier including the driver stage amplifier to the load. The impedance networks are preferably resistors, capacitors, or network combinations thereof.

An additional feedback path may also be provided from the load to the input of the first amplifier. The additional feedback path may include a low pass filter and more specifically a T-network of two resistors and a capacitor, and may help flatten out the frequency response of the amplifier at low frequencies. An intermediate amplifier stage may also be added between the driver stage amplifier and the main output stage to provide additional versatility and distortion reduction.

The first and second amplifiers are both preferably operated in low power dissipation modes, although in some embodiments where power dissipation is not as critical, one or both of the amplifiers can be operated in a higher power dissipation mode in order to, e.g., simplify the design, further reduce distortion (if necessary), or for other reasons. As used herein a low power dissipation mode or low dissipation mode generally includes those operating modes in which standing or idle current dissipation is kept low, and thus would generally include Class B, G and H modes, and potentially Class AB mode in certain configurations.

As one example, the first amplifier including the driver amplifier stage may be operated in a Class AB mode, while the second amplifier including the main output stage may be operated in a Class B and/or Class G or H mode. Thus, the overall power draw of the amplifier may be kept very low. The second amplifier may alternatively be operated in Class AB mode at the expense of increased power dissipation, which may lower distortion even further. As another example, both the first and second amplifiers can be operated in Class G mode, or both operated in Class H mode, or one in Class G mode and the other in Class H mode. The novel amplifier designs disclosed and taught herein therefore provide a great deal of flexibility and versatility in terms of operating mode selection and overall design configuration. The amplifier design can be tailored for specific purposes including extremely low power dissipation, very low distortion, compact structure, etc., or combinations thereof.

FIG. 1 is a generic schematic diagram of an example of a conventional linear amplifier 100 as known in the prior art. As shown in FIG. 1, the linear amplifier 100 includes an input stage 110, a driver stage 120, and an output stage 150 that may include, for example, a pair of transistors 131 and 132 (also labeled as Q1 and Q2 in FIG. 1) coupled to positive and negative voltage rails 130, 135 (also labeled as +V and −V in FIG. 1). The input stage 110, driver stage 120, and output stage 150 are connected in a serial arrangement. The input stage 110 receives an input signal 106 from an input signal source 105. The output stage transistors Q1, Q2 are normally biased by a voltage source 128 (also labeled Vb) into either Class B or Class AB operation. While shown in FIG. 1 as single transistors, the output stage transistors Q1 and Q2 may be embodied as different types of circuit such as single transistors, compound transistor arrangements or FETs. The output stage 150 provides an amplified output signal 140 to a load 145 (represented as an impedance in FIG. 1).

Also in FIG. 1, a feedback capacitor 124 (also labeled as Z2 in FIG. 1) applies local feedback around the driver stage 120 whilst ensuring stability by introducing a 6 dB/octave roll-off to the open loop frequency response of the amplifier 100. Driver stage 120 is typically biased into Class A operation. Input stage 110 is typically implemented as a transconductance stage. Additional resistors 115 and 112 (also labeled as R4 and Rg in FIG. 1) provide overall negative feedback around the complete amplifier.

As mentioned earlier, an amplifier of this generic type generally suffers from poor idle and dynamic dissipation performance when biased into Class AB operation, and poor distortion performance when biased into Class B operation. Dissipation can be reduced by operating in Class G mode, but then more distortion mechanisms are introduced which are difficult to address by means of conventional negative feedback.

Figure 2:
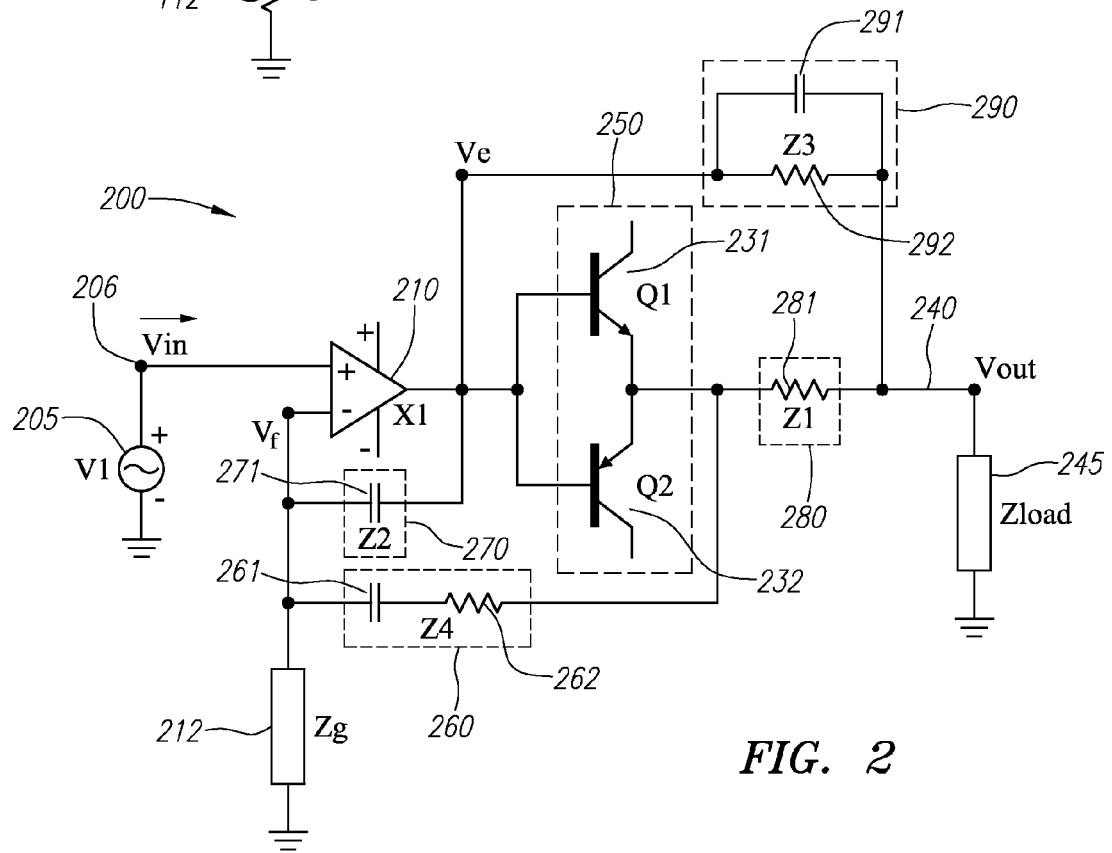
FIG. 2 is a schematic diagram of an amplifier showing, among other things, an arrangement of impedance networks in accordance with one embodiment as disclosed herein.

According to one or more embodiments disclosed herein, and as explained for example in connection with FIG. 2, distortion is significantly reduced over the conventional linear amplifier of FIG. 1 by providing a signal path from the gain/driver stage X1 to the output by means of an impedance network Z3 whilst also introducing another impedance network Z1. FIG. 2 is a schematic diagram of a novel amplifier design in accordance with one embodiment as disclosed herein, illustrating a useful arrangement of impedance networks and other amplifier circuitry by way of one example. In FIG. 2, an amplifier 200 includes, among other things, a gain/driver stage 210 (also labeled as X1 in FIG. 2) and an output stage 250 that may include, for example, a pair of transistors 231 and 232 (also labeled as Q1 and Q2 in FIG. 2) coupled, similar to FIG. 1, to positive and negative voltage rails +V and −V (not shown in FIG. 2). The gain/driver stage 210 receives an input signal 206 from an input signal source 205. While shown in FIG. 2 as single transistors, as with FIG. 1 and all other embodiments that will be described herein, the output stage transistors Q1 and Q2 may be embodied as different types of circuit such as single transistors, compound transistor arrangements or FETs. The output stage 250 provides an amplified output signal 240 to a load 245 (represented as an impedance in FIG. 2).

More generally, the gain/stage 210, while conceptually shown as a single amplifier in FIG. 2, may be constructed from multiple amplifier stages or may be included as part of a larger amplifier block. Likewise, the output stage 250, while shown as primarily consisting of transistors Q1 and Q2, may be included as part of a larger amplifier block which may contain one or more stages, and would also be understood to include bias components, protection elements, and other conventional features that are not shown in detail in FIG. 2 for the sake of simplicity. Those skilled in the art will appreciate that there are many different ways to implement the gain/driver stage 210 and output stage 250 of amplifier 200.

As noted above, an impedance network 290 (also labeled as Z3 in FIG. 2) is provided between the output of the gain/driver stage 210 and the load 245. Another impedance network 280 (also labeled as Z1 in FIG. 2) is provided between the output stage 250 and the load 240. Another impedance network 270 (also labeled as Z2 in FIG. 2) is provided from the output of the gain/driver stage 210 to one of the differential inputs of the gain/driver stage 210. A fourth impedance network 260 (also labeled as Z4 in FIG. 2) is provided from the output stage 250 to the same differential input of the gain/driver stage 210. Impedance networks 260 and 270 are coupled to ground (or some other reference potential) by another impedance network 212 (also labeled as Zg in FIG. 2).

In the example of FIG. 2, impedance network 290 is embodied as a capacitor 291 and resistor 292 connected in parallel. Impedance network 280 is embodied as a resistor 281. Impedance network 270 is also embodied as a resistor 271. Impedance network 260 is embodied as a resistor 262 and capacitor 261 connected in series.

Choosing the values of the impedance networks Z1, Z2, Z3, Z4 such that they satisfy the relationship $Z1(s) \cdot Z2(s) = Z3(s) \cdot Z4(s)$, the distortion on the amplifier 200 can be significantly reduced compared to a standard feedback amplifier of the type shown in FIG. 1. As noted above, in this example impedance network Z1 is preferably embodied as a resistor, impedance network Z2 is preferably embodied as a capacitor, impedance network Z3 is preferably embodied as a parallel combination of resistor and capacitor, and impedance network Z4 is preferably embodied as a series combination of resistor and capacitor, although other equivalent impedance networks may be used. The time constant of the impedance network Z3 preferably matches that of impedance network Z4. At low frequencies, below the frequency at which the impedance of Z3 become capacitive, impedance network Z3 appears resistive in nature and impedance network Z4 appears to be capacitive. The presence of impedance network Z3 softens the crossover knee of the output stage 250 by virtue of the driver stage to load output connection through impedance network Z3.

In order to gain maximum distortion reduction, impedance network Z4 is preferably capacitive in nature so that the ratio of impedances of Z2:Z4 equals Z3:Z1. However, this means that the open loop gain of the feedback loop around the output stage 250 no longer falls off with frequency. Incorporating a series resistor within Z4 reinstates the fall in gain with frequency above the breakpoint at which Z4 stops appearing capacitive and becomes resistive in nature. The resistor 262 in impedance network Z4 is chosen to set a unity loop gain frequency that ensures stability.

To retain full distortion reduction, impedance network Z3 should be made to appear capacitive in nature at high frequencies; hence the matching of the time constants of impedance networks Z3 and Z4. There is generally a free choice of time constant for the components of impedance networks Z3 and Z4. However, the larger the time constant, the larger the capacitor has to be in impedance network Z3, and the greater the current that will be drawn from the gain/driver stage 210 (i.e., X1) at high frequencies. To minimize size of the amplifier 200, the time constant for impedance networks Z3 and Z4 should be kept low.

The balancing of the impedance networks will work even in the presence of parasitic elements in the impedance networks. For instance, a parasitic inductance in series with resistor 281 can be balanced by placing a suitable value resistor in series with capacitor 291. As reflected by the example of FIG. 2, all of the components of impedance networks Z1-Z4 can be realized as resistors, capacitors or combinations thereof (excluding parasitic elements). This design approach can lead to a very compact amplifier package. The term "resistor" in this context includes any resistive element that displays a substantially constant impedance relationship over the applicable operating frequency range, and will typically, but not necessarily, involve a conventional discrete resistor component.

By itself, the choice and arrangement of impedance networks in FIG. 2 works adequately but can be improved. For example, the incorporation of the series capacitor 262 within impedance network Z4 means that below the break frequency formed by its series resistor/capacitor combination of elements 261 and 262, the closed loop gain of the complete amplifier 200 increases at 6 dB/octave as frequency decreases. Additionally, the open loop gain around transistors Q1, Q2 due to the arrangement of impedance networks Z2 and Z4 and gain/driver stage 210 becomes constant at low frequencies rather than rising at 6 dB/octave with decreasing frequency as with a conventional feedback amplifier. Thus, the distortion reduction around transistors Q1 and Q2 by means of negative feedback will be lowered as compared to a conventional amplifier with this choice of impedance networks. Additional distortion reduction will still be achieved by virtue of the incorporation of impedance network Z3 into the amplifier 20, but there is still room for improvement, as will be explained in more detail below. Also, the output resistance of the amplifier 200 is approximately equal to the parallel combination of the impedance networks Z1 and Z3. In the case where the first impedance network Z1 is embodied as a resistor, the output resistance of the amplifier 200 at low frequencies is generally higher than would be the case for a purely conventional feedback amplifier such as illustrated in FIG. 1.

Figure 3:
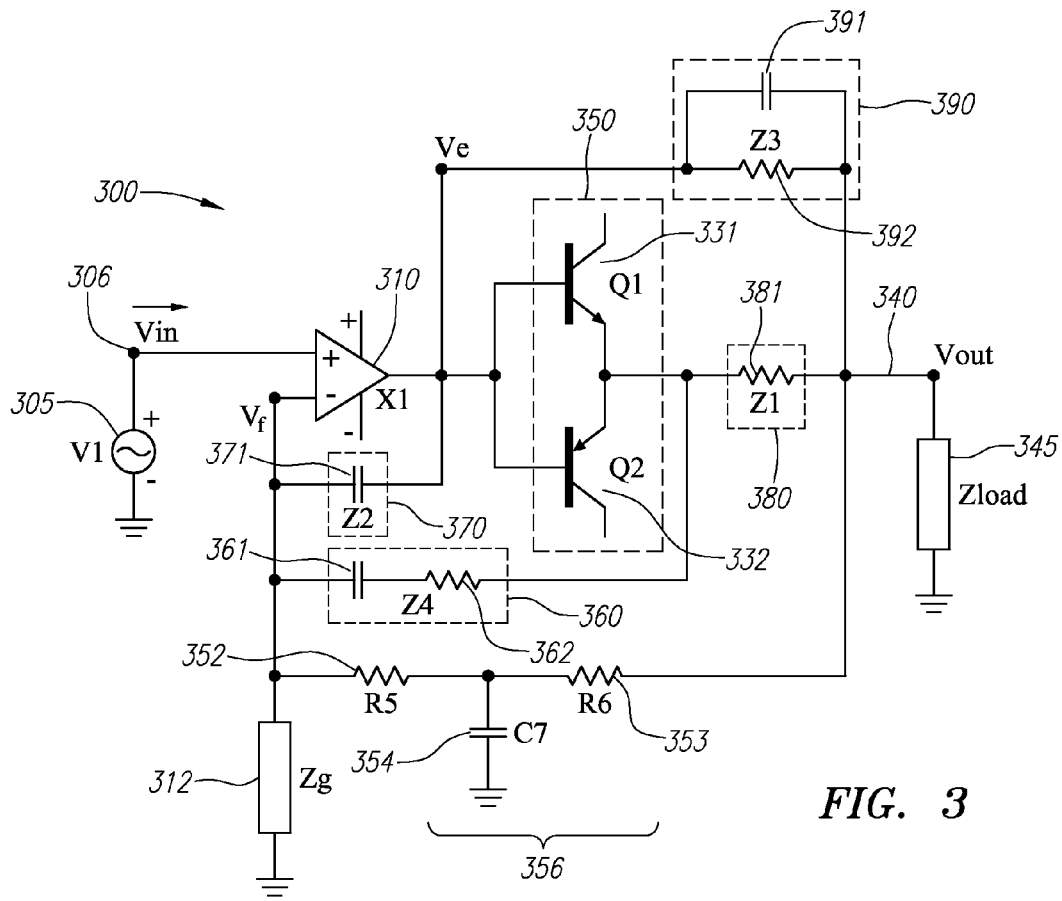
FIG. 3 is a schematic diagram of another embodiment of an amplifier similar to that of FIG. 2, but having an additional feedback loop.

FIG. 3 illustrates how further improvements can be made to distortion performance and closed loop response in the foundational amplifier design of FIG. 2. In FIG. 3, elements labeled 3xx generally correspond to the similar elements labeled 2xx in FIG. 2. In FIG. 3, an amplifier 300 receives an input signal 306 from an input signal source 305. Similar to the amplifier 200 of FIG. 2, the amplifier 300 of FIG. 3 includes a gain/driver stage 310, an output stage 350 comprising transistors 331 and 332 (also labeled as Q1 and Q2), and impedance networks 360, 370, 380 and 390 (also respectively labeled as Z4, Z2, Z1 and Z3 in FIG. 3). A network 356 comprising resistors 352, 353 (also labeled as R5, R6 in FIG. 3) and a capacitor 354 (also labeled as C7 in FIG. 3) has been added to the amplifier 300 to form an additional feedback loop. The feedback is taken from the final output 340 of the amplifier 300 rather than the output stage 350 directly although it is then fed into the same feedback input terminal of gain/driver stage 310 as the existing feedback loop that is based upon impedance networks Z2 and Z4. Notwithstanding this, this connection of the extra feedback loop does not upset the conditions required for maximum distortion reduction.

Simply adding another resistive feedback path to the amplifier arrangement of FIG. 2 would generally result in a non-flat frequency response because extra feedback loop is placed around the closed loop system of FIG. 2, and the closed loop gain is not large enough to ensure that the final closed loop response of the amplifier is independent of the value of the FIG. 2 closed loop gain. However, by designing the extra feedback network 356 to have a low pass filter response with a cut-off frequency that matches the breakpoint frequency of impedance networks Z3 and Z4 and with an appropriate gain, then the overall amplifier 300 can be designed to have a flat response. Thus the rising low frequency response of the amplifier system of FIG. 2 is perfectly compensated by the design additions of FIG. 3.

The extra feedback loop of FIG. 3 provided by the addition of feedback network 356 also additionally reduces distortion at low frequencies, compensating for the compromised low frequency distortion performance of the FIG. 2 amplifier implementation. Furthermore, this extra feedback loop also reduces the output impedance of the amplifier at low frequencies since the feedback is taken from directly across the load 345 and hence impedance network Z1 is within this feedback loop.

Having the extra overall frequency dependent feedback loop to lower the output impedance of the amplifier 300 allows the bridge impedance network Z1 to have a higher impedance than would otherwise be possible, within the constraints of power losses within the resistor 381 of the impedance network Z1; thus, the impedance of element Z3 can be similarly increased to lower the value of the parallel capacitance and with it the high frequency current that must be sourced from the gain/driver stage 310.

The available choices of capacitor and resistor values for impedance networks Z1-Z4 means that balancing at high frequency ranges can be more accurately attained, since capacitors and resistors of the values used for the amplifier design of FIG. 3 can be readily obtained with close manufacturing tolerances. The voltage that appears across the capacitor 391 within impedance network Z3 is quite small (it is only the gain/error loss in the output stage plus the product of the output current times the impedance of Z1) and so its package size, given the low voltage requirements of the capacitor 391, is also commensurately small, allowing for miniaturization of the amplifier 300. Multiple amplifiers using the design shown in FIG. 3 can be placed in close proximity with little interaction between the impedance networks, because the lack of balancing inductors means that there is less possibility of magnetic coupling among the amplifiers.

The use of the additional impedance networks Z1, Z3 and Z4 and the extra feedback loop provided by the addition of feedback network 356 allows the high frequency distortion of the amplifier 300 to be significantly lower than a conventional feedback amplifier and so the output stage 350 could potentially be operated, for example, in Class B mode whilst still avoiding crossover distortion. Thus, idle power dissipation that normally occurs due to the quiescent current required to bias a conventional amplifier output stage into Class AB mode is eliminated by the design of FIG. 3. This might be of limited use if the gain/driver stage 310 of amplifier 300 were required to have a high idle current drain. However, the gain/driver stage 310 in this example operates at much lower power than the main output stage 350 based around transistors Q1 and Q2, and so the gain/driver stage 310 can be configured with a Class AB output stage 350 having linear, fast output devices (transistors Q1 and Q2) and so still operate with low distortion compared to the main output stage 350. Thus the dissipation in the gain/driver stage 310 can also be very low.

By incorporating a low power Class AB output stage internally within the gain/driver stage 310, the distortion introduced into the error signal by the Class AB operation of the gain/driver stage 310 can be made exceedingly small. Typically, for an audio power amplifier according to the design shown in FIG. 3 capable of delivering 100 Watts nominal output power into a 16 ohm load, the gain/driver stage 310 can be configured to operate for instance with only 1-2 milliamps of quiescent current, which is quite low.

Given the significant reduction in high frequency distortion of the output stage 350, the dynamic power dissipation of the amplifier 300 can also be reduced by employing a Class G or Class H architecture. Unlike with a conventional feedback amplifier, the high frequency distortion components introduced by the Class G rail switching transitions or Class H tracking scheme will be reduced by using the amplifier feedback configurations of some of the embodiments disclosed herein so that a very low distortion, very low idle power dissipation, low dynamic power dissipation amplifier can be realized. One example of a tracking power supply that can be used in conjunction with the amplifier designs disclosed herein to provide additional power savings is described in co-pending U.S. patent application Ser. No. 12/253,047 filed on Oct. 16, 2008, assigned to the assignee of the present invention, and hereby incorporated by reference as if set forth fully herein. The use of a Class G or H architecture for the first amplifier containing the gain/input stage may have the potential to introduce non-linearities into the system, which could need to be controlled or otherwise taken account of.

Where a Class G or H architecture is applied to both the first and second amplifiers, different power rails (with different voltage levels) may be provided to the first amplifier and the second amplifier to, e.g., help isolation, reduce non-linearities, and minimize power dissipation.

Figure 4:
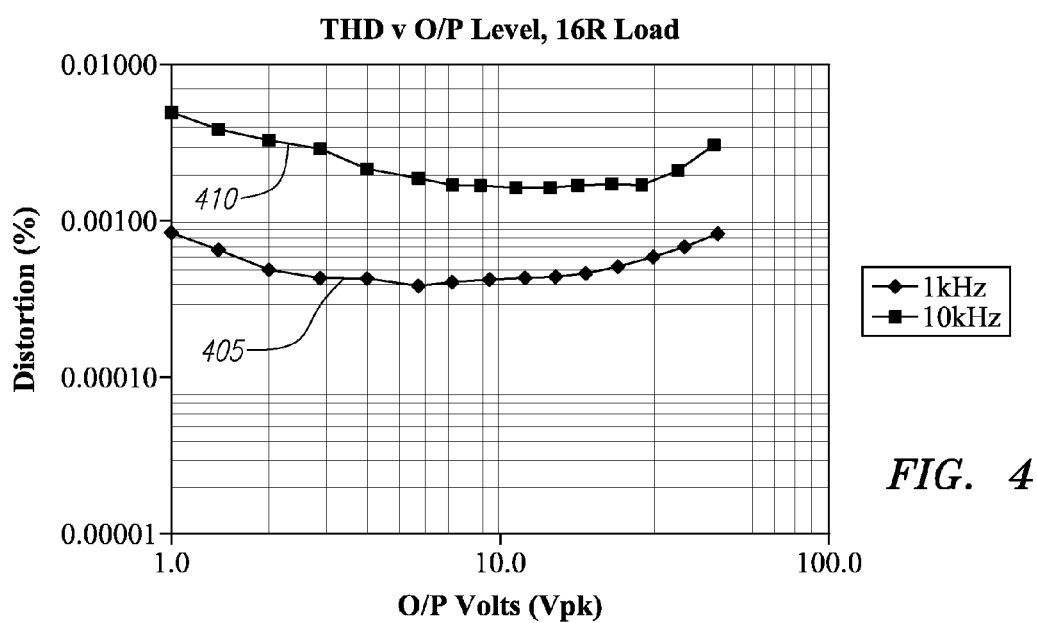
FIG. 4 is a graph showing an example of distortion performance that can be achieved by an amplifier built according to the principles disclosed herein, under certain load parameters.

FIG. 4 shows an example of the distortion performance that can be achieved by an amplifier built according to the principles outlined above, when capable of driving a 56 Volt peak signal into a 16 ohm load using an amplifier design constructed according to FIG. 3. As shown in FIG. 4, the total harmonic distortion is quite low at relatively low frequencies (generally ranging from about 0.0003 to 0.0010 percent distortion level at 1 kHz), and remains low even at higher frequencies (generally ranging from about 0.0020 to 0.0050 percent distortion level at 10 kHz).

Figure 8A:
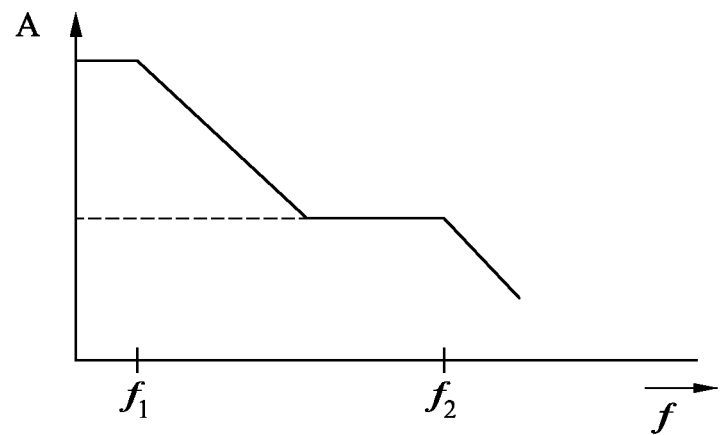
FIGS. 8a and 8b are diagrams comparing the frequency responses of different amplifier designs.
Figure 8B:
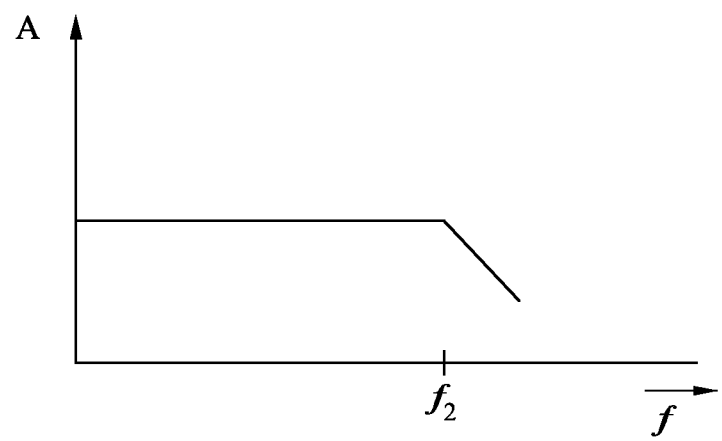

FIGS. 8a and 8b are idealized frequency response graphs showing the effect of the additional feedback loop 356 in the embodiment of FIG. 3. FIG. 8a shows that at relatively low frequencies, the overall amplifier gain drops off, then flattens out at a shelf region, and then later drops off again with increasing frequency. By using the additional feedback loop of FIG. 3, this frequency response can be altered as shown in FIG. 8b. The low frequency response is perfectly compensated by the outer feedback loop, resulting in a flat frequency response out to relatively high frequencies. The outer frequency loop can also be used for additional purposes, such as to extend the operating range of the amplifier through the introduction of an additional zero and pole at high frequencies.

Further modifications or enhancements can also be made to the amplifier architectures described above. For example, although the distortion of the Class AB gain/driver stage 310 can be made to be low compared to that of the output stage 350, it will still generate some residual distortion. To overcome this, the Class AB gain/driver stage 310 can itself employ the same distortion reduction technique as used around the output stage 250 as previously outlined in connection with FIG. 2.

Figure 5:
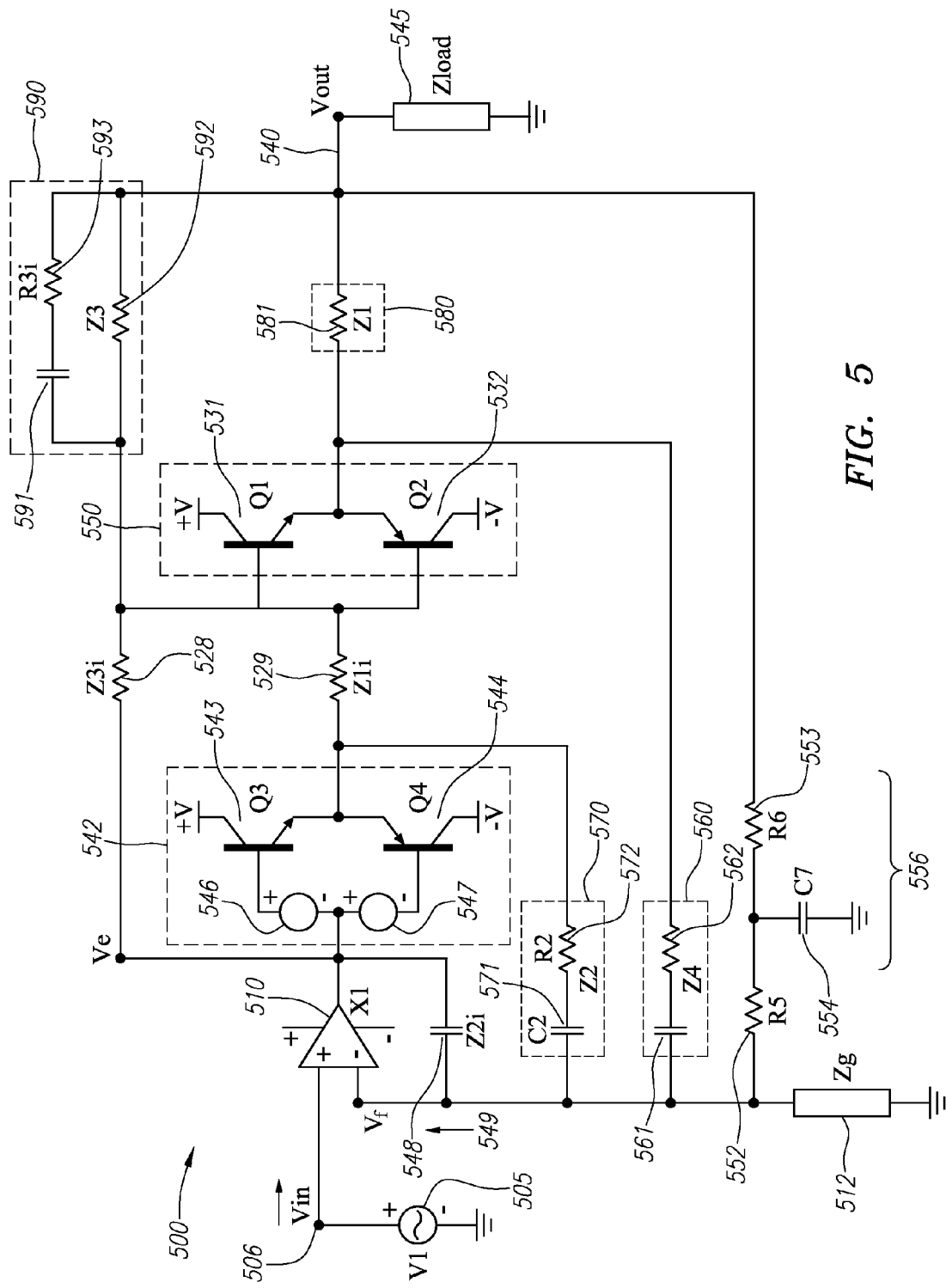
FIG. 5 is a block diagram of another amplifier design using an amplifier cascading technique.

This "cascaded" approach is illustrated in the amplifier design shown in FIG. 5. Elements in FIG. 5 labeled "5$xx$" generally correspond to the similar elements labeled "3$xx$" in FIG. 3. In FIG. 5, an amplifier 500 receives an input signal 506 from an input signal source 505. Similar to the design of FIG. 3, the amplifier 500 includes a gain/driver stage 510, an output stage 550 comprising transistors 531 and 532 (also labeled as Q1 and Q2), and impedance networks 560, 570, 580 and 590 (also respectively labeled as Z4, Z2, Z1 and Z3 in FIG. 5). An additional feedback network 556 comprising resistors 552, 553 (also labeled as R5, R6 in FIG. 5) and a capacitor 554 (also labeled as C7 in FIG. 5) is included in the amplifier 500, having the same general purpose as in FIG. 3, with feedback being taken from the final output 540 of the amplifier 500 and fed into the feedback input terminal of gain/driver stage 350. Also added in FIG. 5 is an intermediate stage 542, which in one aspect may act as a second or supplemental driver stage, comprising transistors 543 and 544 (also labeled as Q3 and Q4) and voltage bias components 546 and 547. The transistors 543 and 544 and coupled to the positive voltage rail +V and negative voltage rail −V respectively, and may be biased into Class AB operating mode by bias components 546 and 547

The output of the intermediate stage 542 is coupled to the input of the output stage 550 via a resistor 529 (also labeled as Z1$i$ in FIG. 5). An additional resistor 528 (also labeled as Z3$i$) is connected from the input of the output stage 550 to the input of the intermediate stage 542. The feedback taken from impedance network 590 (Z3) thus passes through resistor 528 for purposes of intermediate stage 542, although it is still applied directly to the input of the output stage 550. An additional capacitor 548 (also labeled Z2$i$ in FIG. 5) is provided from the output of the gain/driver stage 510 to the feedback input terminal thereof. The feedback derived from impedance network 570 (Z2) is taken from the output of the intermediate stage 542 instead of the output of the gain/driver stage 510. The additional elements 529, 548 and 528 (Z1$i$, Z2$i$ and Z3$i$) form part of an inner feedback loop, while impedance network 570 (Z2) shares its operation between the inner and outer feedback loops.

Both the gain/driver stage 510 and the intermediate stage 542 provide some aspect of feed-forward operation, in that both provide current to the load when the main output stage 550 is relatively idle, and hence both may be viewed as having a driver function to some degree. Both stages may also supply gain. In this respect, the designation of particular stages as "gain" or "driver" stages is not intended to be limiting.

In the example shown in FIG. 5, the inner loop components 529, 548 and 528 (Z1$i$, Z2$i$ and Z3$i$) have been chosen, along with impedance network 570 (Z2), such that the inner loop realizes the distortion reduction condition described for the FIG. 3 amplifier design, with the Class AB stage (i.e., the internal output stage of gain/drive stage 510, in certain embodiments) retaining an integrator type response in respect of the action seen by the outer loop. A resistor 572 (R2) has been added to impedance network 570 (Z2) to help ensure stability of the inner feedback loop around transistors Q3 and Q4, while another resistor 592 (R3$i$) has been added to impedance network 590 (Z3) to compensate the outer feedback loop for the zero introduced into the integrator response by resistor 572. This arrangement makes it possible for the other outer loop components of impedance networks Z1-Z4 to remain the same as the example illustrated in FIG. 3. The retention of the high frequency roll-off of the improved driver stage comprising gain/driver stage 510 and intermediate stage 542 allows stability of the feedback loop around the output stage 550, and the final overall feedback loop still allows for low output impedance of the amplifier 500 at audio frequencies.

Other arrangements of the inner loop impedance networks are also possible. For example, if an extra gain stage is introduced before gain/driver stage 510, then capacitor 571 (C2) in impedance network 570 (Z2) could be dispensed with and resistor 528 (Z3$i$) replaced with a capacitor. The gain of this inner loop would then be flat with frequency, so the extra gain stage could be given an integrator response and the outer bridge and loop components Z4, R5, R6, C7, Zg could be connected to the input of the additional integrator gain stage.

Figure 6:
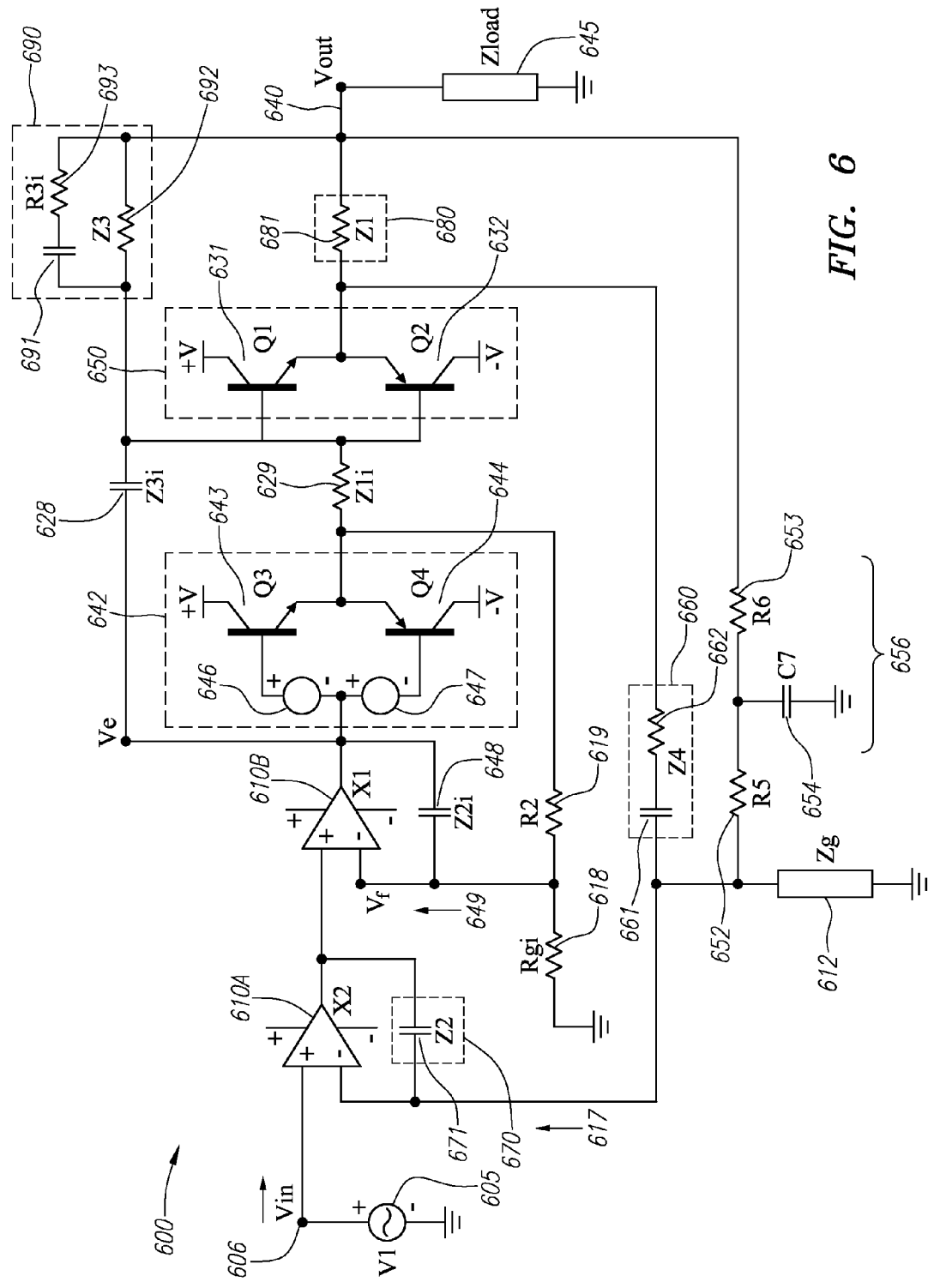
FIG. 6 is a block diagram illustrating another example of an amplifier design in accordance with various embodiments as disclosed herein.

Such an arrangement is detailed in FIG. 6. Elements in FIG. 6 labeled "6$xx$" generally correspond to the similar elements labeled "5$xx$" in FIG. 5. In FIG. 6, an amplifier 600 receives an input signal 606 from an input signal source 605. Similar to FIG. 5, the amplifier 600 includes a gain/driver stage 6108, an intermediate stage 642 comprising transistors 643 and 644 (also labeled as Q3 and Q4) and voltage bias components 646 and 647, and an output stage 650 comprising transistors 631 and 632 (also labeled as Q1 and Q2), along with impedance networks 660, 670, 680 and 690 (also respectively labeled as Z4, Z2, Z1 and Z3 in FIG. 6). An additional gain stage 610A (also labeled X2 in FIG. 6) has been added before the gain/driver stage 610B. The amplifier 600 further includes an outer feedback network 656 comprising resistors 652, 653 (labeled as R5, R6) and capacitor 654 (labeled as C7), having a similar purpose as in FIGS. 3 and 5, with feedback being taken from the final output 640 of the amplifier 600 and fed into a feedback input terminal of gain stage 610A. In this case, the impedance network 670 (Z2) is positioned between the output of the gain stage 610A and the feedback input terminal of gain stage 610A. Similarly, the impedance network 660 (Z4) is positioned between the output of the driver stage 650 and the feedback input terminal of gain stage 610A.

The feedback from the output of gain/driver stage 610B continues to run through capacitor 648 (Z2$i$) into the feedback input terminal of the gain/driver stage 610B. A feedback connection is also made from the output of the intermediate stage 642 to the feedback input terminal of the gain/driver stage 610B. In this case, the feedback element is a resistor 619 (also labeled as R2), and another resistor 618 (also labeled Rgi) has been added coupling the feedback input terminal of the gain/driver stage 610B to ground (or some other reference potential). Capacitor 628 and resistor 629 (also labeled as Z3$i$ and Z1$i$ respectively) perform similar functions to their counterparts in FIG. 5, both of them forming part of the inner feedback loop.

In the design of FIG. 6, the added gain stage 610A is configured with an integrator response (using the capacitor 671 of impedance network Z2), and the outer bridge and loop components Z4, R5, R6, C7, Zg are connected to the feedback input of the added gain stage 610A instead of the gain/driver stage 610B. The gain of the inner feedback loop including resistors 618 and 619 (Rgi and R2) is flat with frequency.

As with FIG. 5, in the example of FIG. 6 the other inner loop components 629, 648 and 628 (Z1$i$, Z2$i$ and Z3$i$) have been chosen, along with impedance network 670 (Z2), such that the inner loop realizes the distortion reduction condition described for the FIG. 3 amplifier design, with the Class AB stage (i.e., the internal output stage of gain/drive stage 510, in some embodiments) retaining an integrator type response in respect of the action seen by the outer loop. The choice of outer loop impedance network values to ensure maximum distortion reduction now has to take account of the gain of the inner loop which increases the effective impedance of Z2 by the ratio [R2+Rgi]/Rgi. A resistor in impedance network 670 (Z2) is not needed for stability of the inner feedback loop around transistors Q3 and Q4. This arrangement again makes it possible for the other outer loop components of impedance networks Z1-Z4 of the FIG. 3 amplifier design to remain the same. The retention of the high frequency roll-off of the inner amplifier subsystem comprising gain stage 610A, gain/driver stage 610B, and intermediate stage 642 allows stability of the feedback loop around the output stage 650, and the final overall feedback loop still allows for low output impedance of the amplifier 600 at audio frequencies.

If the output impedance of the inner amplifier subsystem is an appreciable value in comparison to the impedance of Z3, then impedance network Z3 can be modified (i.e., increased) to ensure correct distortion reduction.

By utilizing these extra network arrangements in the amplifier designs of FIGS. 5 and 6, the dissipation of the Class AB driver stage (that is, the internal output stage of the gain/driver stage 510 or 610B, in some embodiments) can be made even lower by reducing the Class AB quiescent current further, since its distortion can be greatly reduced by the techniques described. The Class AB stage of the gain/driver stage 510 or 610B could itself be biased in Class B, resulting in a reduction of idle dissipation.

A further reduction in idle dissipation can be obtained by operating the gain/driver stage 210, 310, 510 or 610B in Class G or H mode, since the quiescent power supply voltage to the gain/driver stage will be lower than would be the case otherwise. This could be done also without the extra network(s) of FIG. 5 or 6, but extra care would be needed in order to eliminate any power supply switching spikes from affecting the output of the gain/driver stage. The extra network circuitry allows any switching distortion introduced into the gain/driver stage to be significantly reduced.

Amplifiers generally incorporate small current sensing resistors in series with the output transistors in order to provide for current limiting protection circuits. Impedance network Z1 employed in the various amplifier designs of FIGS. 2, 3, 5 and 6 can be used to replace these current sensing resistors as depicted in FIGS. 7$a$ and 7$b$. FIG. 7$a$ shows a conventional current limiting circuit arrangement in which a push-pull output stage 700 comprises n-type transistor 711 and p-type transistor 712 (also labeled as Q1 and Q2) that are inter-connected with a combination of circuitry including transistors 721, 722 and 723 (also labeled as Q3, Q4 and Q5 respectively), current source 724 (also labeled as I1), and resistors 714 and 715 through which the output signal passes to reach the final output 720 of the output stage 700. The amount of current that can be output from transistor 711 is limited by the current that passes through resistor 714, and that amount of current is in turn determined by the base-to-emitter voltage of transistor 721. Resistor 715 and transistor 722 operate in a similar fashion to protect transistor 712 from excessive output current.

FIG. 7b, on the other hand, shows a modified current limiting circuit arrangement that takes advantage of the presence of impedance network Z1 to dispense with resistors 714 and 715. In FIG. 7b, output stage 750 comprises n-type transistor 731 and p-type transistor 732 (also labeled as Q1 and Q2) that are again inter-connected with a combination of circuitry including transistors 751, 752 and 753 (also labeled as Q3, Q4 and Q5 respectively), current source 754 (also labeled as I1), and, in this case, resistor 781 which may be the resistor in impedance network Z1 of any of the previous embodiments described herein. In this case, when transistor 731 (Q1) is ON, then resistor 781 serves to limit the output current in the same way as resistor 714, i.e., using the relatively fixed base-to-emitter voltage of n-type transistor 751 to limit the output current, and when transistor 732 (Q2) is ON, then resistor 781 limits the output current in the same way as resistor 715, i.e., using the relatively fixed emitter-to-base voltage of p-type transistor 752 to limit output current.

The invention has generally been illustrated or discussed with particular reference to an audio power amplifier but is by no means limited to this application area. The disclosed techniques apply also, for example, to low power audio amplifiers, video amplifiers and radio frequency amplifiers, among others.

According to various embodiments as disclosed herein, a power amplifier is provided having low power dissipation and, more specifically, is capable of having low idle and dynamic power dissipation levels. The power amplifier may not require a bias setting, and further may not require inductors for EMI or filtering. The power amplifier may also deliver very low distortion levels.

In certain embodiments described herein, a low-power, low-distortion amplifier includes a gain/driver stage, an optional intermediate stage, and an output stage in a cascaded arrangement. A coupling path, which may in one aspect be viewed as a feed-forward path, is provided from the output of the gain/driver stage to the load, via a feed-forward impedance network that may include a capacitor and a resistor connected in parallel. The output stage may be coupled to the load by another impedance network such as a resistor. The output stage may also be coupled to the input of the gain/driver stage by another impedance network, which may take the form of a capacitor and a resistor in a series arrangement. The output of the gain/driver stage may also be coupled to its input by another impedance network, which may take the form of a capacitor.

In addition, a feedback network may be provided from the load to the input of the gain/driver stage for stabilization, which may have the affect of flattening the overall frequency response at low frequencies will leaving the response unchanged at higher frequencies. The additional feedback network may take the form of a low pass filter and, more specifically, a T-network of two series resistors and a capacitor connected between their common node and a reference potential (such as ground). The additional feedback network may be used to counter-act the resistive nature of the frequency response of the feed-forward impedance network at low frequencies. Because the additional feedback network is fed into the negative input of the gain/driver stage, it effectively cancels out the low frequency component of the amplifier's frequency response contributed by the feed-forward impedance network.

In some embodiments, an additional intermediate amplifier stage may be provided, which functions in certain respects as a driver stage, and has a feed-forward path coupling to the load via the third impedance element.

In certain embodiments, the main output stage is operated in Class B mode, while the gain/driver stage is operated in Class AB mode, thus leading to a low power dissipation configuration. At low signal levels, the gain/driver stage (and/or an intermediate amplifier stage) may provide the drive for the output signal via the feed-forward or coupling between the gain/driver stage (and/or the intermediate amplifier stage) and the load, (through impedance network Z3, while at higher signal levels the main output stage drives the load. In alternative embodiments, one or both of the gain/driver stage and the main output stage may be operated in Class G or H mode, with the addition of an appropriate power supply for the amplifier. In alternative embodiments, the main output stage may be operated in Class AB mode, or else in Class A mode. While doing so may increase power dissipation, this configuration may still take advantage of other benefits provided by the novel designs discussed herein.

The novel power amplifier embodiments of FIGS. 2, 3, 5 and 6 may be realized in a very small package and, in particular, may be implemented entirely on a single chip, with the possible exception of the capacitive component of impedance network Z3 which may, in some cases, be large but still relatively small as compared to an inductor, hence allowing smaller overall packaging size. Because of the amplifier's low power dissipation, multiple amplifiers (such as four, eight, or possibly more) may be included on a single chip without the risk of over-heating. Such a chip can be particularly convenient for multi-channel amplifier system such as used in audio applications or for other purposes.

As noted above, the amplifier designs disclosed herein may be suitable for many different types of applications, including audio or sound reproduction, communications, satellites, and other applications. The novel amplifier designs can potentially have very wide frequency range with substantially flat or constant gain, while maintaining low power dissipation and low distortion. For example, the amplifier may provide relatively flat or constant gain over the range of 20 Hz to 20 KHz for audio applications, but is not so limited, and conceptually may provide flat or constant gain over a much larger pass-band, depending upon the specific application.

While preferred embodiments of the invention have been described herein, many variations are possible which remain within the concept and scope of the invention. Such variations would become clear to one of ordinary skill in the art after inspection of the specification and the drawings. The invention therefore is not to be restricted except within the spirit and scope of any appended claims.

What is claimed is:

1. An amplification system, comprising:
a first amplifier operable to receive an input source signal;
a second amplifier connected downstream from the first amplifier;
a first impedance network Z1 coupling the second amplifier to a load;
a second impedance network Z2 operative to provide a feedback signal indicative of an output of the first amplifier to an input of the first amplifier;

a third impedance network Z3 coupling the output of the first amplifier to the load at a common node with the first impedance network Z1; and a fourth impedance network Z4 operative to provide a negative feedback signal indicative of an output of the second amplifier to the input of the first amplifier;

wherein all of said impedance networks Z1, Z2, Z3 and Z4 include resistors, capacitors, or network combinations thereof; and wherein the third impedance network Z3 includes at least a first capacitor.

2. The amplification system of claim 1, wherein the first impedance network Z1 providing said first coupling path comprises a first resistor connected between the output of said second amplifier and the load.

3. The amplification system of claim 2, wherein the second impedance network Z2 comprises a second capacitor.

4. The amplification system of claim 3, wherein the third impedance network Z3 providing said second coupling path comprises a second resistor connected in parallel with said second capacitor between the output of the first amplifier and the load.

5. The amplification system of claim 4, wherein the fourth impedance network Z4 comprises a third capacitor and third resistor connected in series.

6. The amplification system of claim 1, further comprising a fifth impedance network providing a feedback path from the load to the input of said first amplifier, said fifth impedance network comprising a low pass filter.

7. The amplification system of claim 1, wherein said second amplifier is configured to operate in Class B mode, Class G mode or Class H mode.

8. The amplification system of claim 7, wherein said first amplifier is configured to operate in Class AB mode.

9. The amplification system of claim 1, wherein the amplification system has a frequency response that is substantially constant over a low frequency band.

10. The amplification system of claim 1, wherein said second amplifier is operated in Class B mode.

11. The amplification system of claim 10, wherein said first amplifier is operated in Class AB mode.

12. The amplification system of claim 1, wherein said second amplifier is operated in Class G or Class H mode.

13. The amplification system of claim 12, wherein said first amplifier is operated in Class AB mode.

14. The amplifier of claim 1, further comprising an intermediate amplifier stage disposed between the first amplifier and the second amplifier.

15. The amplification system of claim 1, wherein each of said first, second, third or fourth impedance networks Z1, Z2, Z3 and Z4 consists only of one or more resistors, one or more capacitors, or network combinations thereof.

16. The amplification system of claim 1, wherein none of the impedance networks Z1, Z2, Z3 and Z4 includes a balancing inductor.

17. The amplification system of claim 1, wherein the values of the first, second, third and fourth impedance networks Z1, Z2, Z3, and Z4 satisfy the relationship $Z1(s) \cdot Z2(s) = Z3(s) \cdot Z4(s)$.

18. The amplification system of claim 1, wherein a time constant of the third impedance network Z3 approximately matches a time constant of the fourth impedance network Z4.

19. The amplification system of claim 18, wherein at high frequencies an impedance characteristic of impedance network Z3 appears capacitive in nature.

20. The amplification system of claim 19, wherein at low frequencies below which the impedance characteristic of said third impedance network Z3 appears capacitive, the impedance characteristic of the third impedance network Z3 appears resistive.

21. The amplification system of claim 1, wherein the fourth impedance network Z4 comprises a series resistor and a series capacitor, and wherein a value of the series resistor is selected to provide a unity loop gain frequency to facilitate stability of the amplification system.

22. A method for amplifying an input source signal, comprising:

receiving the input source signal at a first amplifier and generating a driver signal thereby;

providing the driver signal to the input of a second amplifier acting as a main output stage;

operating the first amplifier in a Class AB mode;

operating the second amplifier in a Class B, Class G or Class H mode;

coupling the outputs of said first and second amplifiers to a load through respective first and second impedance networks; and providing feedback connections from the outputs of said first and second amplifiers to the respective inputs of said first and second amplifiers to maintain operation of said first and second amplifiers in their respective modes, while alternately driving the load from the first amplifier and the second amplifier through the respective first and second impedance networks.

23. The method of claim 22, further comprising the step of providing the driver signal to an intermediate amplification stage prior to providing it to the second amplifier.

24. The method of claim 22, wherein the step of coupling the outputs of said first and second amplifiers to a load includes coupling the load to the output of the first amplifier through a capacitor and resistor connected in parallel.

25. The method of claim 24, wherein the step of coupling the outputs of said first and second amplifiers to a load includes coupling the load to the output of the second amplifier through a resistor.

26. The method of claim 25, wherein the step of providing feedback connections from the outputs of said first and second amplifiers to the respective inputs of said first and second amplifiers includes providing a feedback path from the load to the input of the first amplifier via a feedback network.

27. The method of claim 26, wherein said feedback network comprises a low pass filter.

28. The method of claim 26, wherein said feedback network compensates for a low frequency response boost related to the parallel connected resistor and capacitor between load and the output of the first amplifier by making the frequency response substantially constant over low frequency ranges.

29. The method of claim 22, wherein first amplifier and second amplifier exhibit low idle power dissipation.

30. The method of claim 29, wherein the output signal remains substantially distortion-free.

31. The method of claim 22, wherein the first and second impedance networks to the load and the feedback connections from the outputs of said first and second amplifiers to the inputs of said first and second amplifiers are formed of resistors, capacitors or combinations thereof, without a balancing inductor.

32. The method of claim 22, wherein the second amplifier operates in a Class B mode.

33. A low dissipation amplifier, comprising:

a driver amplifier operable to receive an input signal;

an output amplifier;

a first impedance network Z1 coupling the output amplifier to a load;

a second impedance network Z2 operable to provide a feedback signal indicative of an output of the driver amplifier to an input of the driver amplifier;

a third impedance network Z3 coupling the output of the driver amplifier to the load; and a fourth impedance network Z4 operable to provide a feedback signal indicative of an output of the output amplifier to the input of the driver amplifier;

wherein the values of the first, second, third and fourth impedance networks Z1, Z2, Z3 and Z4 satisfy the relationship $Z1(s) \cdot Z2(s) = Z3(s) \cdot Z4(s)$; and wherein none of the first, second, third and fourth impedance networks Z1, Z2, Z3 and Z4 or their associated feedback or coupling paths includes a balancing inductor.

* * * * *